United States Patent [19]
Nath

[11] Patent Number: 5,968,287
[45] Date of Patent: Oct. 19, 1999

[54] POWER GENERATING BUILDING PANELS AND METHODS FOR THEIR MANUFACTURE

[75] Inventor: Prem Nath, Rochester Hills, Mich.

[73] Assignee: United Solar Systems Corporation, Troy, Mich.

[21] Appl. No.: 08/858,033

[22] Filed: May 16, 1997

[51] Int. Cl.⁶ .................................................. E04D 13/18
[52] U.S. Cl. ..................... 136/251; 52/173.3; 52/506.01
[58] Field of Search .................... 136/251, 254, 136/291; 52/173.3 R, 509, 506.1

[56] References Cited

U.S. PATENT DOCUMENTS

| | | | |
|---|---|---|---|
| 4,067,764 | 1/1978 | Walker et al. | 156/267 |
| 4,184,903 | 1/1980 | Dillard et al. | 156/104 |
| 4,210,462 | 7/1980 | Tourneux | 136/89 |
| 4,287,382 | 9/1981 | French | 136/244 |
| 4,382,833 | 5/1983 | Coyle et al. | 156/382 |
| 4,421,589 | 12/1983 | Armini et al. | 156/382 |
| 4,450,034 | 5/1984 | Stern | 156/382 |
| 4,860,509 | 8/1989 | Laaly et al. | 136/245 |
| 5,092,939 | 3/1992 | Nath et al. | 136/251 |
| 5,232,518 | 8/1993 | Nath et al. | 136/251 |
| 5,238,519 | 8/1993 | Nath et al. | 156/382 |
| 5,338,369 | 8/1994 | Rawlings | 136/251 |
| 5,768,831 | 6/1998 | Melchior | 136/251 |
| 5,787,653 | 8/1998 | Sakai et al. | 136/251 |

*Primary Examiner*—John Goodrow
*Attorney, Agent, or Firm*—Gifford, Krass, Groh, Sprinkle, Anderson & Citkowski, P.C.

[57] ABSTRACT

A photovoltaic building structure comprises a number of interlockable building panels having photovoltaic generator devices supported thereupon. The photovoltaic devices may be attached to the panels by a vacuum lamination process in which a flexible, air impermeable membrane covers a stack of layers being laminated to the panel. Evacuation of air from between the membrane and panel causes the lamination stack to be compressed against the panel, and a pressure and/or heat activatable adhesive is employed to adhere the various layers to the panel. Installation of the panels is in accord with standard building techniques, and the presence of the photovoltaic generators does not change the mechanical characteristics of the panels.

33 Claims, 5 Drawing Sheets

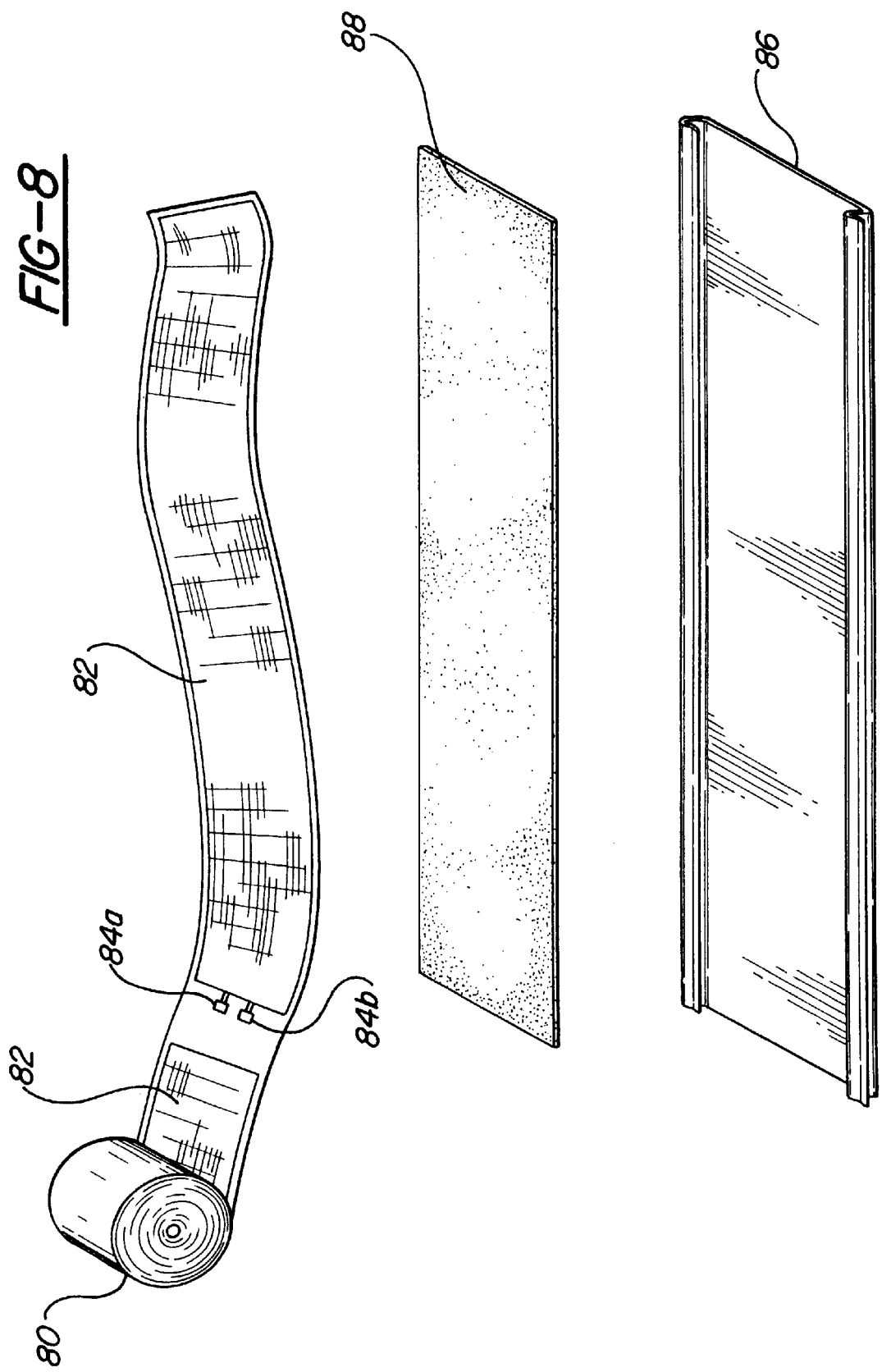

5,968,287

POWER GENERATING BUILDING PANELS AND METHODS FOR THEIR MANUFACTURE

FIELD OF THE INVENTION

This invention relates generally to building structures, and more particularly to architectural panels such as roofing members, wall panels and the like having photovoltaic devices attached thereto. In a specific embodiment, the invention relates to a method for laminating photovoltaic devices to architectural panels, which method does not require the use of extensive apparatus and which may be carried out on preformed panels.

BACKGROUND OF THE INVENTION

Photovoltaic energy is becoming an ever more significant source of electrical power. This is due in part to the growing concern over problems of pollution, safety and scarcity associated with conventional sources of power such as fossil fuels and nuclear energy; and also because of recent advances in technology which have made possible the manufacture of lightweight, large area, low cost photovoltaic devices based upon thin film semiconductor materials.

The power generated by a photovoltaic device is proportional to the illumination incident thereupon, and if relatively large amounts of power are to be generated, fairly large collection areas are required. The roof and upper story areas of building structures are well illuminated, and are generally not productively used. For some time now it has been known to place photovoltaic devices onto the upper portions of buildings, and U.S. Pat. Nos. 5,232,518 and 5,092,939 both disclose particularly configured roofing members having photovoltaic devices affixed thereto. As disclosed in both of these patents, photovoltaic devices are affixed to building panel members during their fabrication, and as is specifically disclosed in U.S. Pat. No. 5,092,939, the photovoltaic devices are laminated to sheet metal stock by a roller based lamination process, and this stock is subsequently bent into an appropriate shape to provide a batten and seam roofing panel.

While the roller based lamination process disclosed in the foregoing is of significant utility, it is not always practical to employ a lamination process of the type disclosed therein. Furthermore, it is often desirable to attach a photovoltaic device to a commercially available, preformed panel. For example, a particular building application may require use of a specific manufacturer's preformed architectural panel either because that panel has already been rated and approved by appropriate agencies, or because it has been specified by a consumer, or because a particular product is already in inventory. Therefore, there is a need for a preformed architectural panel of conventional, commercially accepted design, which further includes a photovoltaic generating element thereupon.

Preformed architectural panels typically include a number of structural features defined thereupon such as raised, bent or otherwise configured connector flanges, reinforcement ribs, interlocks or the like. In other instances, the preformed architectural panel may include a concave or convex central portion onto which a photovoltaic device is to be attached. The presence of such structural features makes the use of a pressure roll lamination process difficult, if not impossible, to implement on preformed panels. Therefore, it will be appreciated that there is also a need for a process whereby photovoltaic devices, particularly large area photovoltaic devices, may be laminated onto relatively large, preformed architectural panels. Often, it will be desirable that the lamination be carried out at a construction site, and in some particular instances, there is a need for a method for laminating photovoltaic devices onto architectural panels which are already affixed to a building structure. In some instances, photovoltaic generating devices may be simply affixed to panels by adhesive or the like; but in other instances, pressure and/or heat must be used to assure a tight bond.

Vacuum lamination processes have been employed in the prior art for the attachment of photovoltaic devices to supporting substrates. However, previous vacuum lamination processes have all required relatively large and complicated lamination systems. For example, U.S. Pat. No. 4,450,034 discloses a vacuum lamination system for use with relatively large work pieces. The system includes a large area framework made from metal I-beam members. It is relatively heavy and expensive, and is not readily adaptable for use at a construction site. Furthermore, the system cannot be employed to laminate photovoltaic devices to a portion of a standing building. Another lamination system is disclosed in U.S. Pat. No. 4,421,589. The system described therein is only capable of accommodating modest sized panels, and comprises a large, precise apparatus not amenable to on site use. Other vacuum lamination processes are shown in U.S. Pat. Nos. 4,382,833; 4,287,382; 4,210,462; 4,184,903 and 5,238,519 as well as in Japanese Patent 1,024,426.

All of the foregoing prior art systems require extensive hardware for supporting a substrate during a lamination process. In addition, the systems are not adaptable for laminating onto nonplanar substrates such as architectural panels having upstanding seams, interlocks and the like. Furthermore, none of the disclosed systems can be operated to laminate a photovoltaic device onto a curved substrate.

It will thus be understood that there is also a need for a lamination method which can be employed to affix photovoltaic devices to architectural building panels, including panels with nonplanar surfaces. The present invention provides for building panels of conventional design, having photovoltaic devices attached thereto, as well as a lamination method which can be advantageously used for their fabrication. The method of the present invention requires minimal hardware and actually uses a portion of the building panel as a part of the lamination system itself. The method of the present invention can be utilized in an on-site application and on standing building structures. These and other advantages of the present invention will be apparent from the drawings, discussion and description which follows.

BRIEF DESCRIPTION OF THE INVENTION

There is disclosed herein a building structure which comprises a plurality of sheet metal panels. Each panel has a generally planar, central portion defined thereupon, a first connector flange disposed along a first edge, and a second connector flange disposed along a second edge. The first connector flange of each panel is capable of lockably engaging a second connector flange of another panel. In this manner, the panels may be lockably joined together. The building structure further includes a plurality of flexible, thin film, photovoltaic generator units. Each of the units is affixed to the central portion of a respective one of the panels. The generator units each comprise a flexible, thin film photovoltaic device having a positive electrode and a negative electrode, a body of laminating material encapsulating the photovoltaic device, and a first lead in electrical communication with the positive electrode of the device and a second lead in electrical communication with the negative electrode of the device. In particular embodiments, the devices are adhesively affixed to the panels, as for example by a heat activatable adhesive, a chemical curing adhesive, or the like. The panel may also include a junction box on one surface thereof for establishing electrical communication to the leads.

The invention also includes a method for manufacturing the panels of the present invention, wherein photovoltaic generator units are affixed to conventional, commercially rated building panels.

There is also disclosed herein a specific method for attaching a photovoltaic device to an architectural panel. The method includes the steps of providing an architectural panel of the type having a central portion defined thereupon, providing a photovoltaic device, and providing an adhesive body. The architectural panel, photovoltaic device and adhesive body are disposed in a superposed relationship so as to form a lamination stack in which the photovoltaic device overlies the central portion of the panel and the adhesive body is interposed therebetween. In a further step, a flexible, air impermeable membrane is disposed atop the lamination stack so that the membrane covers the entirety of the photovoltaic device and projects beyond the entire perimeter thereof so as to contact the architectural panel. At least a portion of an ambient atmosphere is evacuated from the space defined between the membrane and the panel, and atmospheric pressure acting on the membrane then urges the photovoltaic device into contact with the adhesive body and the panel so as to form a laminated structure.

In some embodiments of the invention, the adhesive may comprise a thermally activatable adhesive and the method may include a further step of heating the adhesive body while the photovoltaic device is being urged into contact therewith. Heating may be accomplished, for example, by directing a stream of heated air onto the architectural panel or by contacting the panel with a heating element such as a heated blanket. In other embodiments, the adhesive may comprise a pressure sensitive adhesive.

In further embodiments of the invention, a sheet of electrically insulating material, with or without an additional adhesive sheet, may be interposed between the photovoltaic device and the pan portion of the architectural panel. In some instances, evacuation of the ambient atmosphere from the space between the membrane and panel may be facilitated by disposing a channel forming member, such as a screen mesh or the like between the membrane and the panel. The photovoltaic device may, in some embodiments, comprise a thin film photovoltaic device and may further include a top protective coating thereupon, and this top protective coating may also be laminated to the photovoltaic device during the aforementioned lamination process.

BRIEF DESCRIPTION OF THE DRAWINGS

FIG. 8 is a schematic depiction of the affixation of a photovoltaic generator to a building panel.

DETAILED DESCRIPTION OF THE INVENTION

The present invention provides photovoltaic generating building structures, which are compatible with conventionally employed construction materials and techniques. The present invention also provides a method whereby photovoltaic devices may be readily laminated to a variety of surfaces, including architectural panels. As will be described in greater detail, the process may be carried out on panels having curved or other irregular surface features. The method of the present invention may be carried out at a construction site, and may also be applied to panels which are already incorporated into a building structure.

Figure 1:
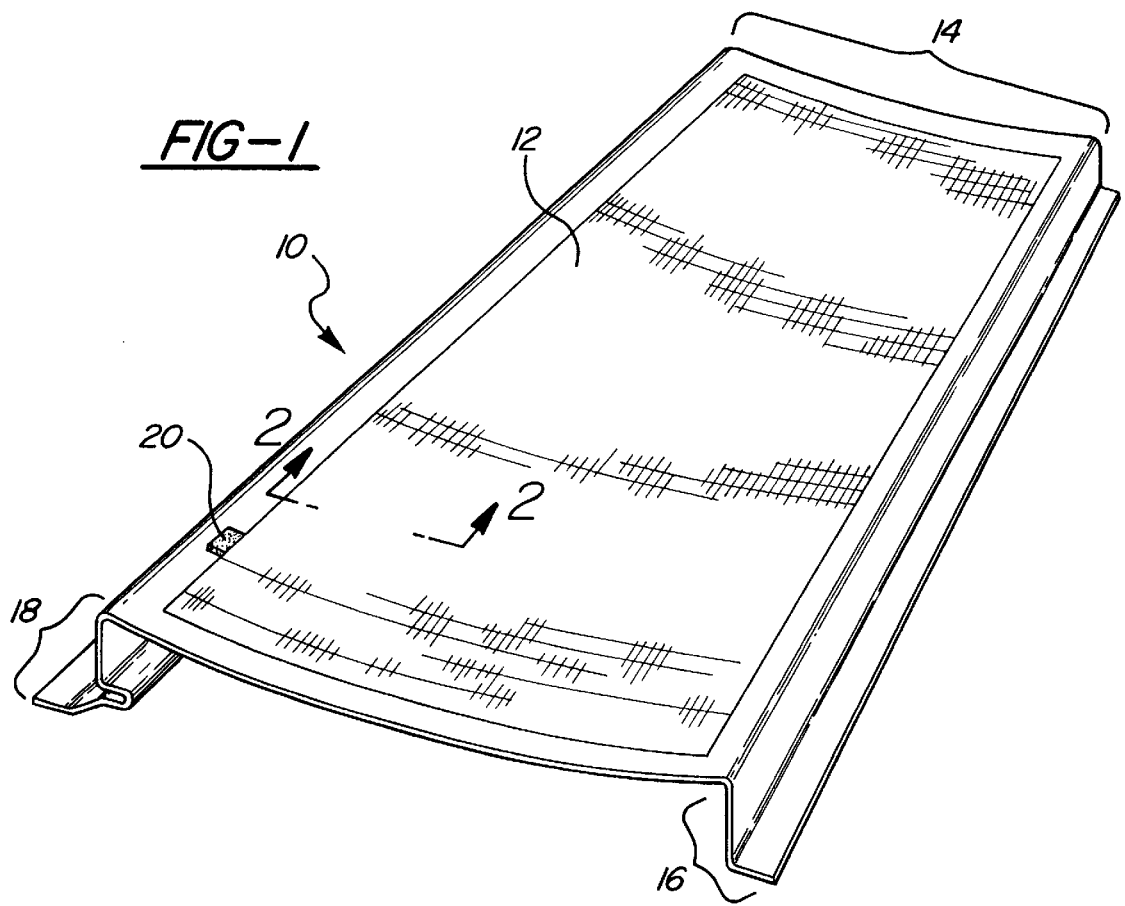
FIG. 1 is a perspective view of one embodiment of architectural panel structured in accord with the principles of the present invention.
Figure 7:
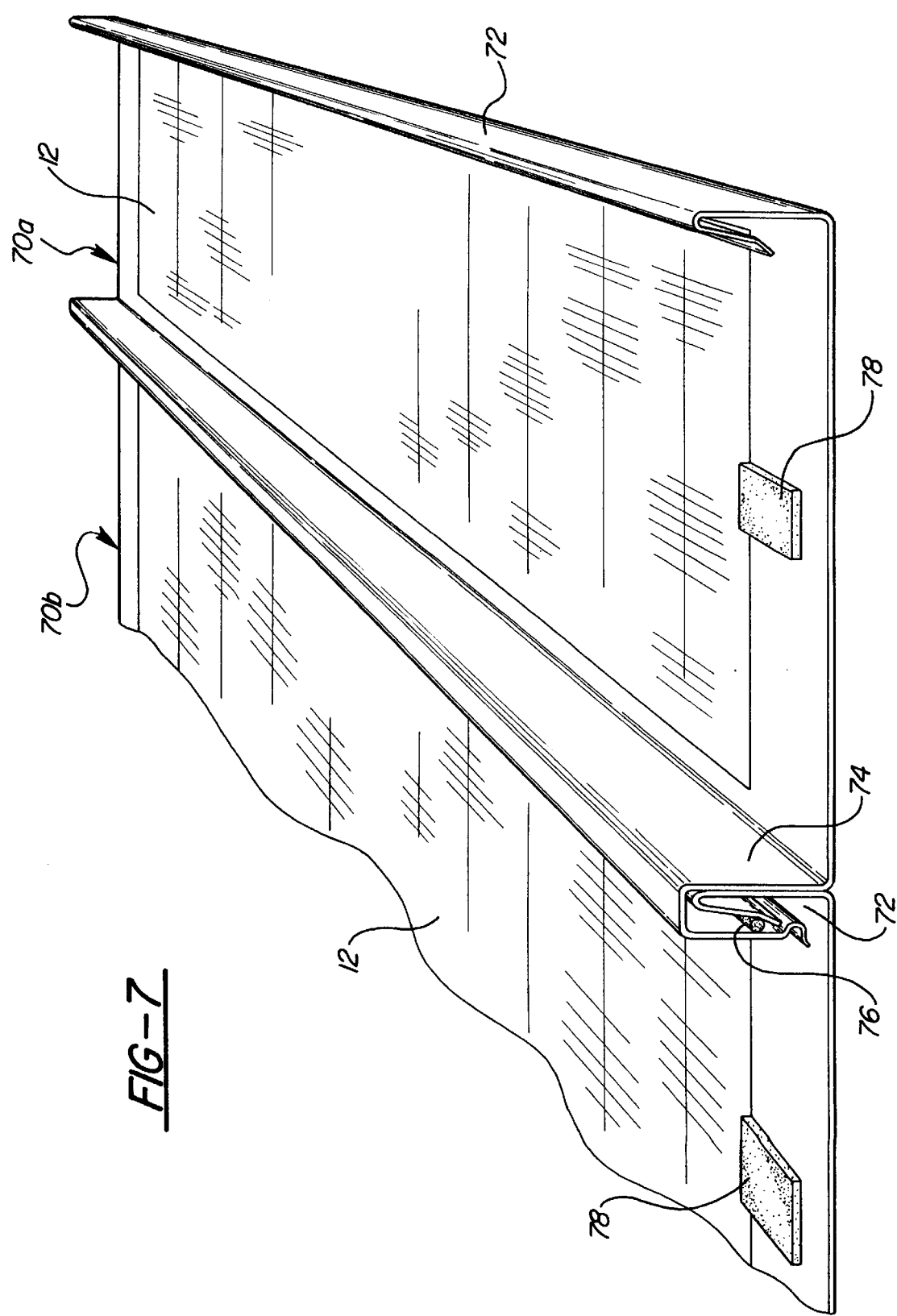
FIG. 7 is a perspective view of a portion of a building structure assembled from interlocked panels of the present invention.

Referring now to FIG. 1, there is shown a perspective view of an architectural panel 10 having a photovoltaic generator device 12 laminated thereto, in accord with the present invention. The panel 10 is meant to be representative of a number of different types of architectural panels, and as specifically illustrated is shown as being a building wall panel of the interlocking tongue and groove type which includes a relatively large, generally concave central portion 14 having a first connector flange comprising tongue portion 16 projecting from edge thereof at approximate right angles and a second connector flange comprising a corresponding groove portion 18 projecting from an opposite edge thereof, also at a right angle. Panels of this type are widely used in a variety of building constructions, and are available from a number of suppliers. For example, the Atas Aluminum Corporation of Allentown, Pa., sells a product of this type under the designation OPV040. While FIG. 1 shows a panel having a photovoltaic generator device affixed to a raised central pan portion, the principles of the present invention may be implemented with panels having a recessed central portion; and such panels are shown in FIG. 7. Still other architectural panels of the general type including one or more central pan portions, and associated connector portions, are well known and available in the art, and it is a notable feature of the present invention that it may be implemented in connection with a variety of such differently configured panels.

As illustrated, the photovoltaic generator device 12 comprises a single, large area, thin film photovoltaic device covering nearly all of the central pan portion 14 of the panel 10. In accord with the present invention, one or more smaller photovoltaic devices may be similarly laminated to the panel. In the illustrated embodiment of FIG. 1, the photovoltaic generator device 12 includes a terminal member 20 at one edge thereof. This terminal member establishes electrical communication with a first and a second lead, each of which is in electrical communication with one of the electrodes of the photovoltaic device 12, and may include connectors such as sockets or pins. The terminal member permits interconnection of the photovoltaic generator to other devices, or to a power supply circuit. In various other embodiments of the present invention, the terminal member may be otherwise disposed; as for example, the terminal may be on the back side of the photovoltaic device 12, in which instance, it may project through the pan portion 14 of the panel 10 into the space therebeneath. In other instances, the photovoltaic device may include a number of separate terminal members thereupon. Furthermore, the terminal member may be enclosed in a junction box.

Figure 2:
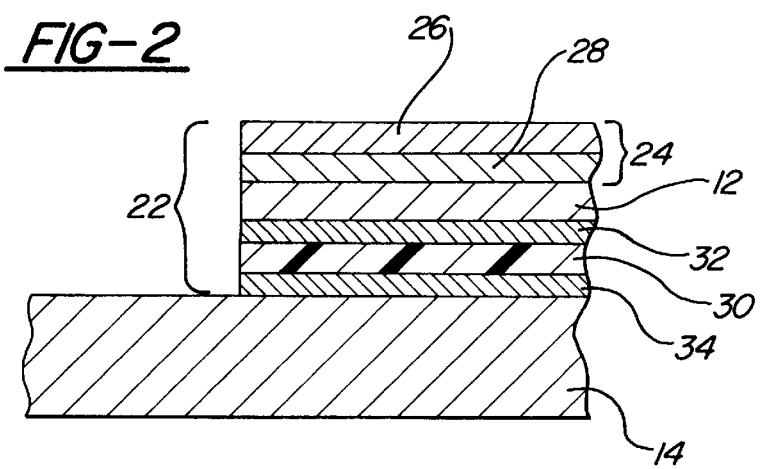
FIG. 2 is a cross-sectional view of a portion of the panel of FIG. 1 taken along line 2—2.

Referring now to FIG. 2, there is shown a cross-sectional view of the panel and photovoltaic device of FIG. 1 taken along line 2—2, through the pan portion 14 of the panel. The panel is typically fabricated from sheet metal, including steel, aluminum, or the like, and its thickness is 0.02–0.05 inches depending upon the particular applications; although, still thicker or thinner stock may be employed for the fabrication of the panels. Disposed atop the central portion 14 of the panel is a series of layers, which in the context of the present description will be referred to as a "lamination stack," as indicated by reference numeral 22. It is to be noted that the thickness of the layers of the lamination stack is generally exaggerated for purposes of illustration. The lamination stack 22 includes a photovoltaic device 12, which is most preferably a thin film, flexible, photovoltaic device such as a silicon alloy photovoltaic device of the type well known in the art; although, other photovoltaic devices such as cadmium sulfide devices may be similarly employed. The photovoltaic device 12 typically includes one or more semiconductor layers disposed and supported upon a flexible substrate, which typically comprises a layer of metal or polymer. The photovoltaic device 12 includes a top electrode at the light incident surface thereof and a bottom electrode at the back surface thereof for the collection of photo generated current, and these electrodes are in electrical communication with a terminal member, such as terminal member 20 shown in FIG. 1.

As illustrated in FIG. 2, the photovoltaic device 12 includes a top protective body 24 on the light incident surface thereof. One particularly preferred protective body 24 comprises a layer of a fluoropolymer 26, such as the fluoropolymer material sold by the DuPont Corporation under the designation Tedlar; and which is adhesively attached to the photovoltaic device 12 by a body of thermally bondable adhesive 28, such as a layer of ethylene vinyl acetate (EVA).

The photovoltaic device 12 is either directly or indirectly adhesively bonded to the pan portion of the architectural panel. In some embodiments, the photovoltaic generator device is fully encapsulated, in a first step, and then bonded to the panel; while in other embodiments, the device is encapsulated and bonded to the panel in a single step. As specifically illustrated with regard to the embodiment of FIG. 2, the photovoltaic device 12 is bonded to a layer of insulating material 30 by an adhesive layer 32, such as a layer of EVA, and the insulating body 30 is in turn bonded to the pan portion 14 of the panel by an additional layer 34 of EVA. In this manner the device 12 is encapsulated. The insulating body 30 is included to prevent any possible short circuiting between the substrate electrode of the photovoltaic device 12 and the central pan portion 14 of the panel. Typically the insulating body 30 will comprise a layer of polymeric material, such as a layer of a fluoropolymer or the like. It is to be understood that the inclusion of the insulating body is optional and will not be required when the photovoltaic device 12 includes an insulating substrate member, or when the architectural panel itself has an electrically insulating coating thereupon.

In carrying out the present invention, the photovoltaic device 12 may be provided with a top protective body 24 in a first, and separate step, in which instance the device 12, bearing the protective body 24 will then be laminated to the panel, with or without the inclusion of the insulating body 30. Alternatively, the top protective body 24 may be laminated to the photovoltaic device 12 at the same time as the device 12 is laminated to the panel.

Adhesives other than EVA may be similarly employed. For example, felt which is saturated with asphalt is employed in the roofing trades; and this material may be used to bond the photovoltaic generator to a roofing panel, through the use of pressure and heat. Other thermally activated and/or pressure activated adhesives may be similarly employed. Alternatively, the generator may be affixed to the panel by a chemically curing adhesive, such as an epoxy or urethane, which does not require the application of heat.

In order to carry out the lamination process, it is necessary to compress the photovoltaic device 12 into contact with the pan portion 14 of the panel, so as to effect the adhesive bonding therebetween. The present invention provides a vacuum lamination method whereby such compression may be readily achieved through the use of a relatively simple system.

Figure 3:
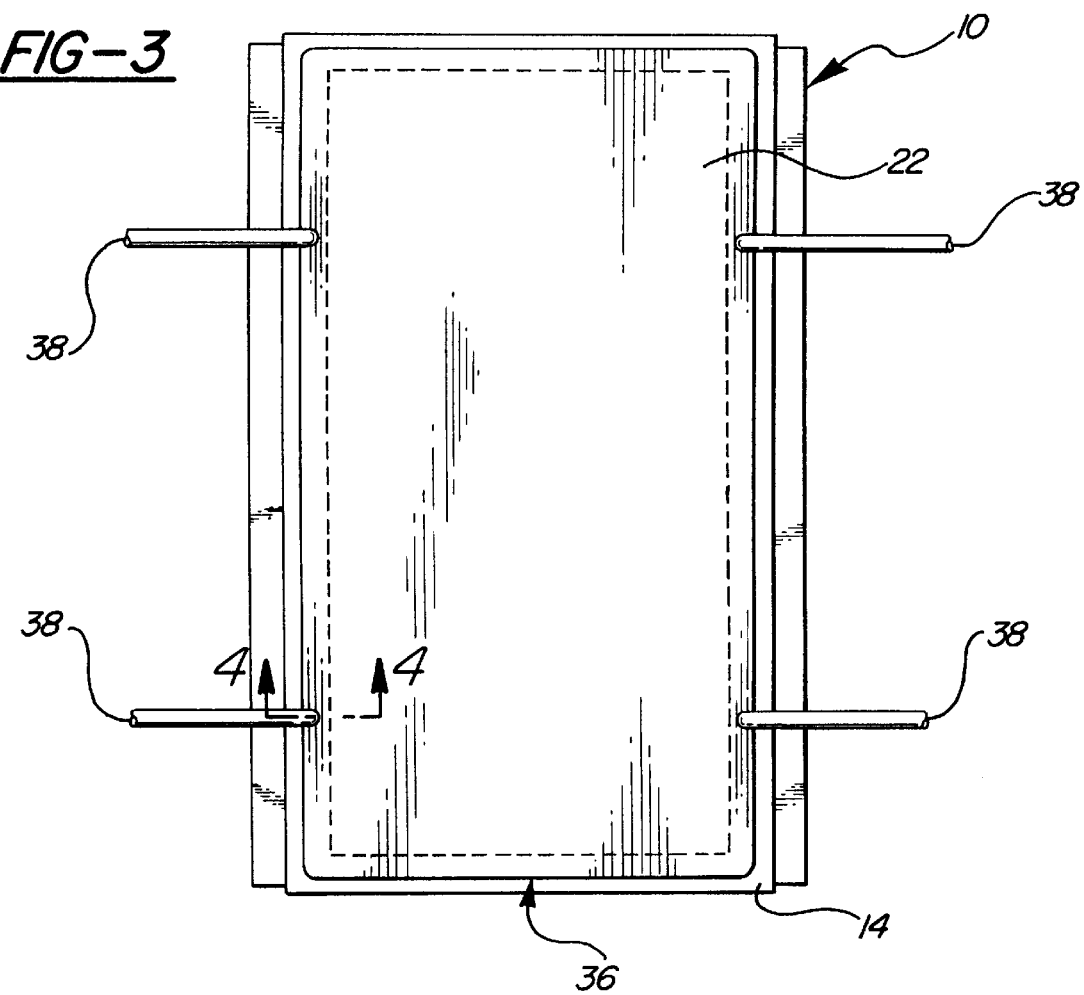
FIG. 3 is a top plan view of the architectural panel of FIG. 1 during one stage of its fabrication.

Referring now to FIG. 3, there is shown an architectural panel 10, generally similar to that depicted in FIG. 1, and the panel 10 is in the process of having a lamination stack 22, shown in phantom outline, adhered thereto. In accord with the present invention, a flexible, air impermeable membrane 36 is disposed upon the pan portion 14 of the panel 10 so as to cover the entirety of the photovoltaic device 12 and extend beyond the entire perimeter thereof. As illustrated in FIG. 3, a number of evacuation conduits 38 are associated with the membrane 36. The conduits 38 are in operative communication with a vacuum pump or the like (not shown) and serve to permit the withdrawal of an ambient atmosphere from beneath the membrane 36. In this manner, atmospheric pressure acting on the membrane 36 will exert a compressive force which urges the photovoltaic device 12 into contact with the panel 10.

Figure 4:
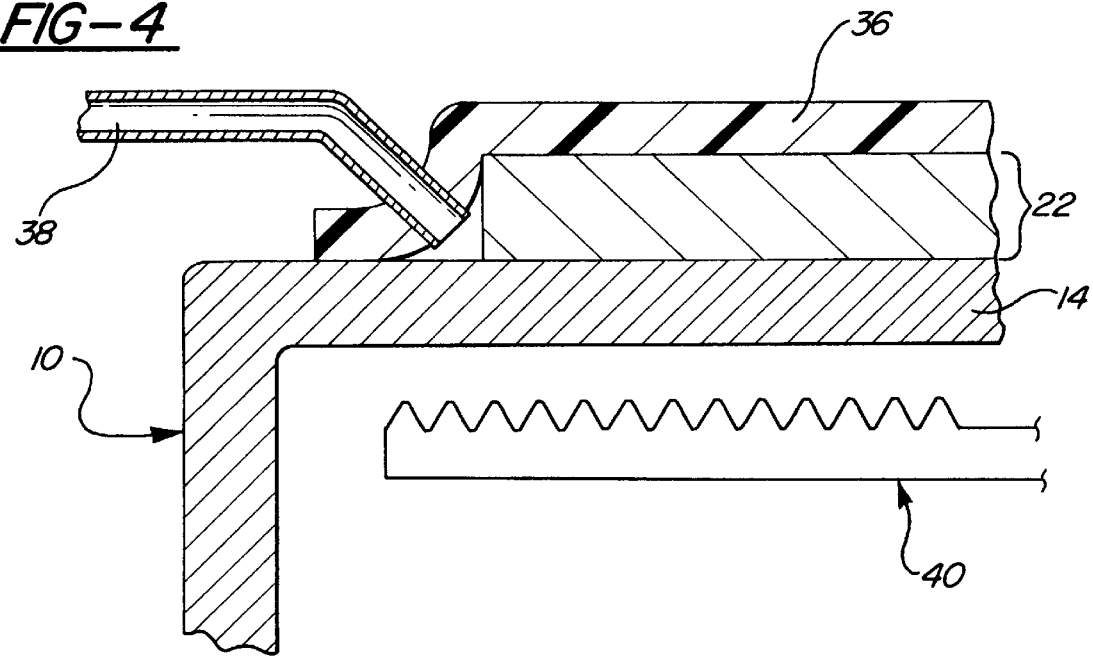
FIG. 4 is a cross-sectional view of a portion of the panel of FIG. 3 taken along line 4—4.

Referring now to FIG. 4, there is shown a cross-sectional view of the panel 10, lamination stack 22, membrane 36 and evacuation conduit 38 as taken along line 4—4. As is shown in FIG. 4, the conduit 38 passes through the membrane 36 and provides a channel whereby an ambient atmosphere may be withdrawn from the space between the membrane 36 and the central pan portion 14 of the panel 10. Evacuation of the ambient atmosphere causes atmospheric pressure acting upon the membrane 36 to compress the lamination stack 22 and panel 10 thereby facilitating bonding therebetween. The adhesive layers incorporated into the lamination stack 22 may comprise pressure sensitive adhesives, in which instance nothing more than atmospheric compression will be needed to effect bonding. In yet other instances, the adhesives may be curable adhesives such as epoxy based adhesives, while in still other instances, the adhesives may be heat activatable adhesives such as thermally activated epoxies, or hot melt adhesives such as EVA, in which instance a source of heat will preferably be applied to the lamination stack 22. As shown in FIG. 4, a resistive heater 40 may be disposed so as to warm the lamination stack 22. As illustrated, heating is accomplished by a resistive heater, although it is to be understood that heating may be similarly accomplished by directing a stream of heated air onto the panel. Alternatively, the panel may be covered with an electrically heated blanket or placed into an oven.

Figure 5:
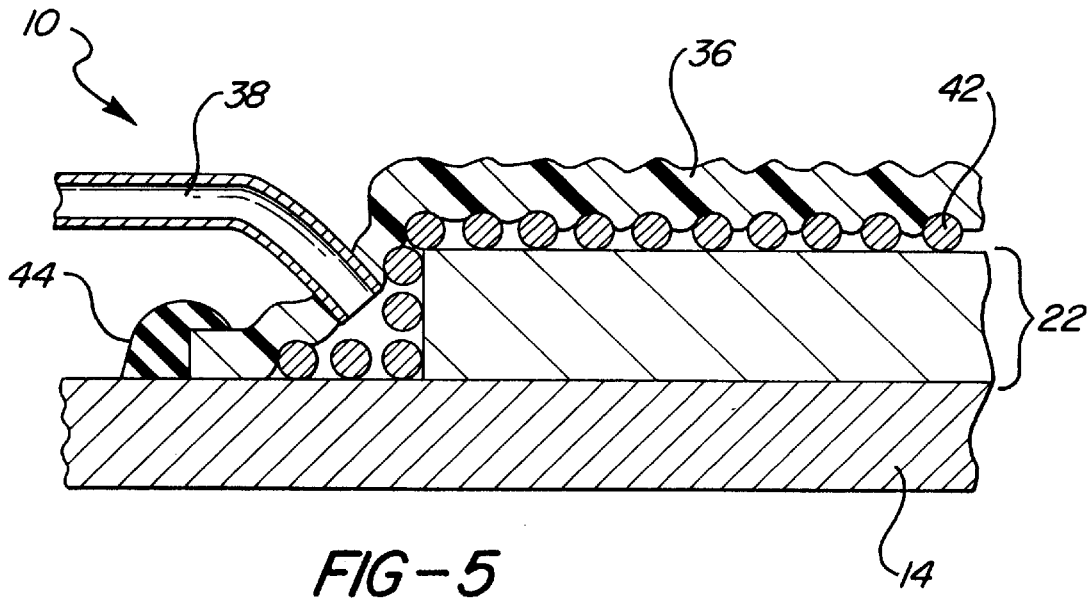
FIG. 5 is a cross-sectional view of a portion of another architectural panel showing a lamination step in accord with the present invention.

FIG. 5 illustrates yet another embodiment for carrying out the vacuum lamination method of the present invention.

Shown in FIG. 5 is a cross-sectional view of a portion of an architectural panel generally corresponding to the pan portion 14 of the aforedescribed panels. Disposed atop the pan portion is a lamination stack 22 as previously described. A membrane 36 having an evacuation conduit 38 associated therewith, and generally similar to those previously described, is disposed atop the lamination stack 22 and in contact with the panel. The embodiment of FIG. 5 includes a screen mesh 42 interposed between the membrane 36 and the lamination stack 22. The screen mesh 42 functions as a channel forming member which defines a series of fluid flow channels between the membrane 36 and stack 22 so as to facilitate evacuation of the ambient atmosphere therefrom. The channel forming mesh 42 also is disposed on a part of the pan portion 14, in the region of the evacuation conduit 38 and prevents the membrane 36 from collapsing against the pan 14.

It will also be noted that in FIG. 5 the membrane 36 includes a sealing bead 44 running around the perimeter thereof. The bead 44 aids in maintaining a vacuum tight seal between the membrane 36 and the panel 10, and in the illustrated embodiment comprises a flexible, elastomeric magnetic body of the type comprised of an elastomeric polymer loaded with magnetic particles. This embodiment is particularly well adapted for use with steel panels. In other variations, the sealing bead 44 may comprise a body of relatively soft, putty-like material. The sealing bead 44 may be an integral part of the membrane 36; or it may be a separate member. It has been found that the inclusion of the sealing body facilitates the placement and retention of the membrane 36 onto the body of the panel 10 prior to drawing a vacuum thereupon. Its use is particularly advantageous when lamination is being carried out on panels disposed in a non-horizontal orientation.

Yet other modifications of the vacuum lamination system of the present invention may be implemented. For example, while the evacuation conduit 38 is shown as piercing the membrane 36 proximate an edge of the lamination stack 22, the membrane 36 may be configured to include an evacuation conduit integral therewith, and the conduit may be placed elsewhere, as for example in the central portion of the membrane, in which instance, a channel forming member such as the screen 42 is preferably included. In yet other instances, the sealing bead 44 may be combined with an evacuation conduit.

The vacuum lamination process of the present invention is readily adaptable to use in conjunction with variously configured building panels and photovoltaic devices. The only piece of hardware specifically required for carrying out the lamination process is a membrane and associated evacuation conduit configured for the particular combination of photovoltaic device and building panel. The membranes are typically fabricated from synthetic or natural rubber or from elastomer coated fabric. They are relatively light and low in cost, and for this reason a fairly large number may be employed at one given time for a particular project. Thus, through the use of the present invention, relatively large areas of building panels may be covered with photovoltaic devices in a relatively short time.

Through the use of the vacuum lamination process, compressive forces are applied uniformly and over a very large area of the building panel and photovoltaic device. Since the panel is an active part of the lamination system there is no net loading of the panel during lamination; hence, deformation of the device or panel is minimized. This is in contrast to prior art vacuum lamination processes which require that a substrate having articles laminated thereto be supported and compressed by a large rigid framework, with resultant deformation.

It is to be understood that in accord with the present invention, architectural panels may have photovoltaic generator devices attached to them by processes other than the aforedescribed vacuum lamination process, although this process is one particularly preferred method for accomplishing the present invention. Since the photovoltaic generator is completely encapsulated independent of the building panel, a variety of lamination techniques and adhesives may be used to attach the generator to the panel. While a good adhesive bond is required, that bond need not be totally void free, because the integrity of the photovoltaic generator is assured by its encapsulation, and not by the body of adhesive. In some instances, the devices may simply be adhesively attached with pressure being applied by gravity, or by magnetic means. For example, one or more magnetic strips may be utilized to hold a photovoltaic generator assembly against a panel, while an adhesive is setting. In those instances where the panel is made from a ferromagnetic material, the magnet will be attracted directly thereto. In those instances where the panel is a nonmagnetic panel, such as an aluminum panel, a ferromagnetic material may be utilized as a backer. For example, a photovoltaic generator may be adhesively affixed to a panel, and a magnet placed on one side of the panel, and a body of ferromagnetic material on the other, so as to compress the photovoltaic generator, adhesive and panel therebetween. In those instances where the panels are disposed in a horizontal orientation, lamination may be accomplished by a gravity process, and a weighting member such as a sandbag, water filled bag, or the like may be placed upon the photovoltaic generator so as to urge it into contact with the panel.

While FIG. 1 illustrates one configuration of panel, yet other configurations of interlocking building panel may be implemented in accord with the present invention. Referring now to FIG. 7, there is shown a partial, perspective view of two panels of the present invention 70a, 70b, as joined together to form a building structure. The panels 70a, 70b are generally similar, and each includes a central pan portion having a photovoltaic generator 12 affixed thereto. The photovoltaic generators 12 are generally similar to those described with reference to the previous figures. Each panel 70 includes a first connector flange 72 disposed along a first edge thereof, and a second connector flange 74 disposed along a second edge thereof. The first connector flange, for example flange 72 of panel 70b, is lockably engagable with the second connector flange, for example flange 74 of panel 70a, so as to permit panels to be joined together in a lockable manner. As further illustrated, an optional bead of sealant 76 may be incorporated in the joint between the flanges 72, 74 to further enhance the integrity of the seal. The sealant 76 may comprise a silicone, natural or synthetic rubber, or an asphalt based material.

As illustrated in FIG. 7, the panels 70 each include a junction box 78 on the front surface thereof. This junction box encloses and protects the terminal members which establish electrical communication with the electrodes of the photovoltaic generator 12. As is known in the art, the terminal box 78 may include a weather tight seal to protect the integrity of the connections therein. As illustrated, the junction box 78 is supported directly on the panel; in some instances, the junction box will be supported upon the photovoltaic generator unit 12, preferably on a non-photogenerating region thereof. In other embodiments of the present invention, the junction box may be disposed on the bottom surface of the panels 70, on the side opposite the photovoltaic generator 12.

It will be appreciated that the panel members 70a of FIG. 7 are generally similar to conventionally employed building panels. Therefore, these panels 70 may be readily installed upon a building by construction workers, in accord with standard building practice. Since the panels are of conventional design, they will meet all appropriate building codes and architectural specifications, and the inclusion of the photovoltaic generator thereupon does not change their mechanical or physical characteristics. Once the panels have been installed by construction workers, electrical personnel can simply wire them into the building's power system through the junction boxes 78, or through other terminals, as previously described.

Figure 6:
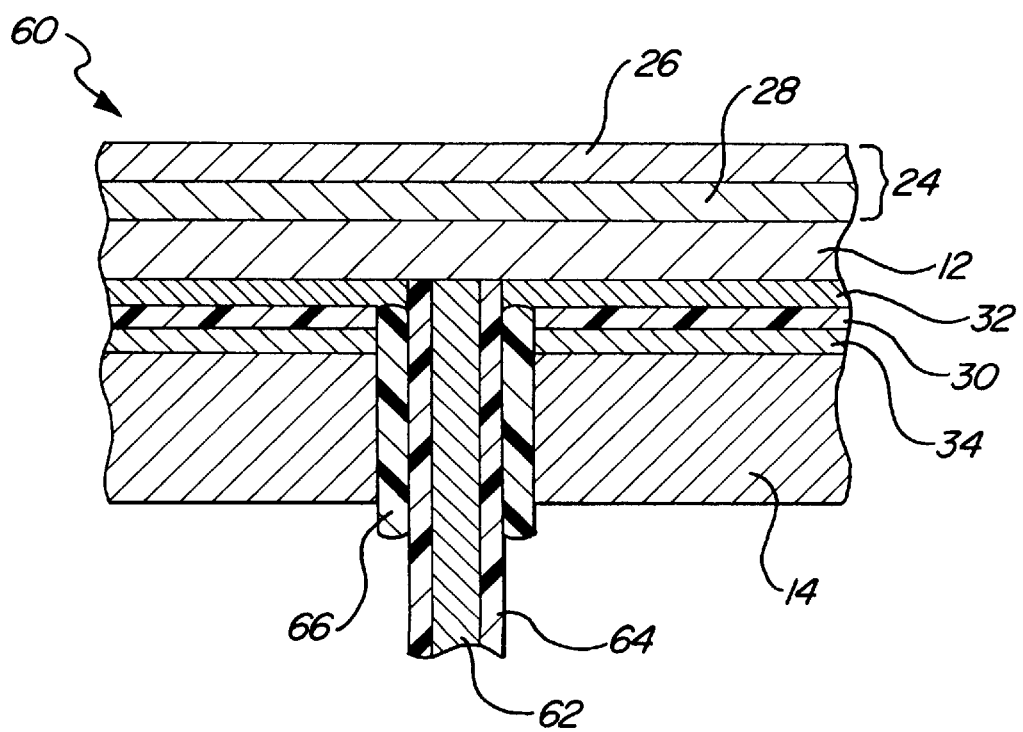
FIG. 6 is a cross-sectional view of a portion of another embodiment of architectural panel structured in accord with the principles of the present invention and including a rear surface electrical lead running therefrom.

Referring now to FIG. 6, there is shown a cross-sectional view of a portion of yet another embodiment of architectural panel 60 fabricated in accord with the present invention, which panel includes a back surface electrical contact. The panel of FIG. 6 may be configured in accord with the panel of FIG. 1, the panel of FIG. 7, or any other panel in accord with the present invention. As shown in FIG. 6, the photovoltaic architectural panel 60 includes a photovoltaic device having an electrically conductive lead 62 in communication with the rear surface thereof, which rear surface comprises a substrate electrode of the photovoltaic device 12. The lead 62 includes a body of electrical insulation 64 thereabout, and the lead 62 and insulation 64 pass through the central pan portion 14 of the architectural panel 60. An insulating body 30, as previously described, separates the photovoltaic device 12 from the pan portion 14 of the panel 60, and as previously described a first 32 and second 34 adhesive body are included to attach the photovoltaic device 12 to the insulating body 30, which in turn is affixed to the pan portion 14 of the panel 60. As in the previous embodiment, the light incident surface of the photovoltaic device 12 is covered by a protective body 24 comprised of a layer of fluoropolymer 26 bonded to the photovoltaic device by an adhesive layer 28. In the illustrated embodiment a sealing grommet 66 is included in the device at the point where the lead 62 passes through the central pan portion 14 of the panel.

In the FIG. 6 embodiment, the lead 62 is disposed so as to be accessible on the bottom side of the architectural panel. In those instances where the panels are configured so as to be supported in a spaced apart relationship with a subjacent building structure, the space between the panels and the structure may be employed to interconnect the various leads of the photovoltaic panels with a power supply system or with one another. In some instances, the lead may be conveyed directly through the subjacent building structure to the interior thereof for appropriate interconnection.

As is known in the art, other configurations of terminal leads are encountered in various photovoltaic devices, and the present invention may be readily adapted to use in conjunction with devices having front surface leads, edge mounted leads, back surface leads or combinations thereof.

In accord with the present invention, encapsulated, self-contained photovoltaic generating units are affixed to standard, commercially rated building panels. The photovoltaic devices may be affixed to the panels at an on-site location, and in some instances, the devices will be affixed to panels which have already been installed onto a building structure; while in other instances, the photovoltaic devices will be affixed to building panels prior to their installation onto the building. In yet other embodiments of the invention, the photovoltaic devices are affixed to the panels at some stage in their fabrication, at an off-site location. In either instance, the general procedure for affixing the photovoltaic devices will be the same.

Referring now to FIG. 8, there is shown a schematic depiction of the affixation of a photovoltaic generating unit to a building panel. As shown in FIG. 8, there is provided a roll 80 comprised of a series of encapsulated photovoltaic generating units 82, as previously described. As illustrated, each of the devices 82 on the roll 80 is separately encapsulated in a body of protective material, and each includes a pair of terminals 84a, 84b. As illustrated, in this embodiment, the terminal members 84 provide front surface contacts, although rear surface contacts may also be implemented. The photovoltaic generating units 82 on the roll 80 are configured to have a length and width which corresponds to the central portion of a building panel 86.

In the practice of the present invention, the roll 80 of photovoltaic generating units 82 may be fabricated at a facility separate from the site at which the building panels 86 are either fabricated or installed. The roll of material 80 is readily transportable, and, since it is encapsulated, it is stable and amenable to handling. A photovoltaic generating unit 82 is unrolled from the roll 80 and cut therefrom along a line, for example line 8—8, which is free of terminals or other devices. The thus freed device is then ready for affixation to a building panel 86. In accord with the present invention, a body of adhesive material, shown here schematically at 88, is disposed between the photovoltaic generating unit 82 and the building panel 86, and the photovoltaic generating unit 82 is then pressed against the panel 86, as described hereinabove. The body of adhesive material 88 may comprise a discrete body of adhesive material such as a body of EVA, a body of asphalt impregnated felt, or a similar body of adhesive material. In other instances, the adhesive material 88 may be first directly applied to the building panel 86, or to the bottom side of the photovoltaic generator 82, for example as by spraying, brushing or the like. In yet other instances, the roll 80 of photovoltaic material may include a body of adhesive coated onto one side thereof, in which instance a protective layer of release paper or the like may be advantageously included in the roll material to prevent blocking.

The body of adhesive 88 may comprise a heat activated adhesive, in which instance, heat will be applied to the assemblage of building panel 86 and photovoltaic device 82; and as previously noted, heat may be applied by heat lamps, resistive heating, heated blankets, a stream of heated air or the like. In those instances where a chemically curing adhesive or a pressure sensitive adhesive is employed, additional heat may not be required.

In any instance, the aforedescribed process will result in the adhesion of the photovoltaic generator 82 to the building panel 86. Electrical communication between the photovoltaic generator 82 and other like generators, or power circuitry, is then established through the terminals 84, which may be optionally enclosed within a junction box or the like.

It is to be appreciated that the method and structure of the present invention also allows for the ready replacement of defective photovoltaic units in a particular installation. Since the photovoltaic generators are completely encapsulated, they may be easily removed from the building panel, if defective, and returned to the factory for repair and/or recycling. Removal of the device may be facilitated by gentle heating, as for example from a hot blanket or hot air gun. Furthermore, through the use of the techniques of the present invention, a replacement photovoltaic device may be readily affixed to the building structure, without removal of the building panel, and without disturbing other devices.

It is to be understood that numerous modifications and variations of the present invention will be readily apparent to one of skill in the art in view of the teaching present herein. The foregoing drawings, discussion and description are directed to some particular embodiments of the present invention but are not meant to be limitations upon the practice thereof. It is the following claims, including all equivalents, which define the scope of the invention.

I claim:

1. A building structure comprising:
a plurality of sheet metal panels, each panel having: a generally planar, central pan portion defined thereupon, a first connector flange disposed along, and projecting from, a first edge of said panel, and a second connector flange disposed along, and projecting from, a second edge of said panel, said first connector flange of each panel being capable of lockably engaging a second connector flange of another panel, whereby said panels may be lockably joined together;
a plurality of flexible, thin film, photovoltaic generator units, each comprising: a flexible, thin film photovoltaic device having a positive electrode and a negative electrode, a body of laminating material encapsulating said photovoltaic device, a first lead in electrical communication with said positive electrode and a second lead in electrical communication with said negative electrode; each of said photovoltaic generator units being affixed to the central pan portion of a respective one of said panels.

2. A building structure as in claim 1, wherein said photovoltaic generator units are adhesively affixed to said panels.

3. A building structure as in claim 2, wherein said photovoltaic generator units are adhesively affixed to said panels by a heat activatable adhesive.

4. A building structure as in claim 2, wherein said photovoltaic generator units are adhesively affixed to said panels by a chemically curing adhesive.

5. A building structure as in claim 2, wherein said photovoltaic generator units are adhesively affixed to said panels by a pressure sensitive adhesive.

6. A building structure as in claim 2, wherein said photovoltaic generator units are adhesively affixed to said panels by an asphalt adhesive.

7. A building structure as in claim 1, wherein each of said panels further include a junction box affixed thereto, said box configured to provide electrical communication with said first and second leads.

8. A building structure as in claim 7, wherein said junction box is supported on the central pan portion of said panel, on the same side thereof as is the photovoltaic generator.

9. A building structure as in claim 7, wherein said junction box is supported on said panel, on a side thereof opposite the side on which the photovoltaic generator is affixed.

10. A building structure as in claim 1, wherein said photovoltaic generator units each include a group IV semiconductor material therein.

11. A method of manufacturing a power generating building structure, said method comprising the steps of:
providing a flexible, thin film, photovoltaic generator unit comprising: a thin film, photovoltaic device having a positive electrode and a negative electrode, a body of laminating material encapsulating said photovoltaic device, a first lead in electrical communication with said positive electrode, and a second lead in electrical communication with said negative electrode;
providing a sheet metal building panel having: a generally planar, central pan portion defined thereupon, a first connector flange disposed along, and projecting from, a first edge of said panel, and a second connector flange disposed along, and projecting from, a second edge of said panel, wherein the first connector flange of said panel is capable of lockingly engaging a second connector flange of a like panel; whereby said panel and said like panel may be lockably joined together; and then,
affixing said photovoltaic generator unit to the central pan portion of said panel.

12. A method as in claim 11, wherein the step of affixing said photovoltaic generator unit comprises adhesively affixing said photovoltaic generator unit.

13. A method as in claim 12, wherein said step of adhesively affixing said photovoltaic generator unit comprises affixing said photovoltaic generator unit with a heat activatable adhesive.

14. A method as in claim 12, wherein the step of adhesively affixing said photovoltaic generator unit comprises affixing said photovoltaic generator unit with a chemically curing adhesive.

15. A method as in claim 11, wherein the step of adhesively affixing said photovoltaic generator unit comprises affixing said photovoltaic generator unit with a pressure sensitive adhesive.

16. A method as in claim 11, wherein the step of adhesively affixing said photovoltaic generator unit comprises affixing said photovoltaic generator unit with an asphalt adhesive.

17. A photovoltaic building panel comprising:
a sheet metal panel having: a generally planar, central pan portion defined thereupon, a first connector flange disposed along, and projecting from, a first edge thereof, and a second connector flange disposed along, and projecting from, a second edge thereof, said first connector flange being capable of lockingly engaging a second connector flange of a like panel, whereby said panel and said like panel may be lockably joined together;
a flexible, thin film photovoltaic generator unit, comprising: a flexible, thin film photovoltaic device having a positive electrode, a negative electrode, a body of laminating material encapsulating said photovoltaic device, a first lead in electrical communication with said positive electrode, and a second lead in electrical communication with said negative electrode, said photovoltaic generator unit being affixed to the central pan portion of said panel.

18. A method for attaching a photovoltaic device to an architectural panel, said method comprising the steps of:
providing an architectural panel including a pan portion defined thereupon;
providing a photovoltaic device;
providing an adhesive body;
disposing said architectural panel, photovoltaic device and adhesive body in a superposed relationship so as to form a lamination stack, comprising said photovoltaic device and adhesive body, in which said photovoltaic device overlies the pan portion of the architectural panel and the adhesive body is interposed therebetween;
disposing a flexible, air impermeable membrane atop said lamination stack so that said membrane covers the entirety of said photovoltaic device and projects beyond the entire perimeter thereof and contacts said architectural panel; and
evacuating at least a portion of an ambient atmosphere from a space defined between said membrane and said architectural panel, whereby atmospheric pressure acting on said membrane urges said photovoltaic device into contact with said adhesive body and said architectural panel.

19. A method as in claim 18, wherein the step of providing an adhesive body comprises providing an adhesive body which is thermally activatable, said method including the further step of heating said adhesive body while said membrane urges said photovoltaic device into contact with said adhesive body and said architectural panel.

20. A method as in claim 19, wherein said step of heating said adhesive body comprises directing a stream of heated air onto said architectural panel.

21. A method as in claim 19, wherein said step of heating said adhesive body comprises contacting said architectural panel with a heated blanket.

22. A method as in claim 18, wherein the step of providing an adhesive body comprises providing a pressure sensitive adhesive body.

23. A method as in claim 18, wherein the step of providing an adhesive body comprises providing an asphalt adhesive body.

24. A method as in claim 18, including the further step of disposing a sheet of electrically insulating material in said lamination stack between said photovoltaic device and said pan portion of the architectural panel.

25. A method as in claim 24, wherein the step of disposing said sheet of electrically insulating material comprises disposing a sheet of electrically insulating material having a second adhesive body associated therewith.

26. A method as in claim 18, including the further step of disposing a channel forming member between said membrane and said panel, said channel forming member being operative to maintain a gas flow channel between said membrane and said lamination stack when said step of evacuating is implemented.

27. A method as in claim 26, wherein the step of disposing said channel forming member comprises disposing a screen mesh member between the photovoltaic device and the membrane.

28. A method as in claim 18, wherein the step of providing a photovoltaic device comprises providing a flexible, thin film photovoltaic device.

29. A method as in claim 18, wherein the step of providing a photovoltaic device comprises providing a photovoltaic device having a top protective layer affixed to a light incident surface thereof.

30. A method as in claim 18, including the further step of disposing a bondable layer of top protective material in said lamination stack and upon a light incident surface of the photovoltaic device, prior to the step of disposing said flexible air impermeable membrane atop the lamination stack, wherein atmospheric pressure acting on the membrane when the step of evacuating is implemented will urge the bondable layer of top protective material into contact with the light incident surface of the photovoltaic device.

31. A method as in claim 18, wherein the step of providing a photovoltaic device comprises providing a photovoltaic device of the type including a terminal lead for establishing electrical communication therewith, and wherein the step of providing an architectural panel comprises providing a panel including an opening defined therein for passage of said lead therethrough.

32. A method as in claim 18, wherein the step of providing an architectural panel comprises providing an architectural panel having a planar pan portion defined thereupon.

33. A method as in claim 18, wherein the step of providing an architectural panel comprises providing an architectural panel having a curved pan portion defined thereupon.

* * * * *